United States Patent [19]

Braun et al.

[11] Patent Number: 5,832,194
[45] Date of Patent: Nov. 3, 1998

[54] ELECTRONIC APPARATUS, PROCESS FOR ITS DUPLICATION, AND ARRANGEMENT FOR DATA TRANSFER BETWEEN TWO SIMILARLY CONSTRUCTED ELECTRONIC APPARATUS

[75] Inventors: Fritz Braun, Kernen; Joachim Finsterbusch; Nikolaus Decius, both of Lippstadt, all of Germany

[73] Assignees: Hella KG Hueck & Co.; Mercedes-Benz AG, both of Germany

[21] Appl. No.: 710,512

[22] Filed: Sep. 18, 1996

[30] Foreign Application Priority Data

Feb. 24, 1996 [DE] Germany .................. 196 07 101.1

[51] Int. Cl.$^6$ .................................................... G06F 11/00
[52] U.S. Cl. ................ 395/180; 395/182.04; 395/184; 395/185; 395/186; 395/187; 395/750
[58] Field of Search .............................. 395/180, 182.04, 395/184, 185, 186, 187, 750.01

[56] References Cited

U.S. PATENT DOCUMENTS

| | | | |
|---|---|---|---|
| 4,639,852 | 1/1987 | Motomiya | 364/138 |
| 4,700,292 | 10/1987 | Campanini | 364/200 |
| 4,937,732 | 6/1990 | Brundisini | 364/145 |
| 5,083,264 | 1/1992 | Platteter et al. | 395/575 |
| 5,134,619 | 7/1992 | Henson et al. | 371/40.1 |
| 5,195,100 | 3/1993 | Katz et al. | 371/66 |
| 5,210,866 | 5/1993 | Milligan et al. | 395/575 |
| 5,274,645 | 12/1993 | Idleman et al. | 371/10.1 |
| 5,301,308 | 4/1994 | Daar et al. | 395/575 |
| 5,335,540 | 8/1994 | Bowler et al. | 73/146.5 |
| 5,396,620 | 3/1995 | Burghart et al. | 395/575 |
| 5,412,661 | 5/1995 | Nao et al. | 371/10.1 |
| 5,432,922 | 7/1995 | Polyzois et al. | 395/425 |
| 5,509,117 | 4/1996 | Haug | 395/182.08 |
| 5,526,482 | 6/1996 | Stallmo et al. | 395/182.04 |
| 5,539,638 | 7/1996 | Keeler et al. | 364/424.03 |
| 5,566,316 | 10/1996 | Fechner et al. | 395/441 |
| 5,572,659 | 11/1996 | Iwasa et al. | 395/182.04 |
| 5,596,706 | 1/1997 | Shimazaki et al. | 395/182.04 |
| 5,600,783 | 2/1997 | Kakuta et al. | 395/182.04 |
| 5,608,684 | 3/1997 | Reasoner et al. | 395/228 |
| 5,617,530 | 4/1997 | Stallmo et al. | 385/182.04 |
| 5,680,580 | 10/1997 | Beardsley et al. | 395/489 |
| 5,737,510 | 4/1998 | Kakuta et al. | 395/182.04 |

FOREIGN PATENT DOCUMENTS

| | | |
|---|---|---|
| 35 40 599 A1 | 5/1987 | Germany . |
| 88 16 458 U | 10/1989 | Germany . |

OTHER PUBLICATIONS

Electronik Informationen Nr. Nov. 1989, pp. 70 & 72; Steven Moore and K. D. Kroczek, Siliconix GmbH, Filderstadt,Germany; "Verriegelbare Analogschalter vereinfachen Bus–Interface".

Electronik 7/31.3.1989; pp. 60&62; Steven Sidman; "Verbindet jedes mit jedem"; Multiple Bus Exchange schaltet Systemelemente zusammen.

*Primary Examiner*—Meng-Ai T. An
*Assistant Examiner*—Valerie Darbe
*Attorney, Agent, or Firm*—Griffin, Butler, Whisenhunt & Szipl, LLP

[57] ABSTRACT

An electronic apparatus, process for its duplication, and arrangement for data transfer between two similarly constructed electronic apparatus is described in which the electronic apparatus has a microprocessor or microcontroller, a non-volatile memory, and an interface. The microprocessor or microcontroller, the non-volatile memory and other measures of the apparatus allow a data content of a certain memory component of a certain other apparatus to be simply transferred into the non-volatile memory. The apparatus thus has the ability to bequeath its data characteristics, or to duplicate itself. Further, a process is described for carrying out such a duplication. Assuming a second inventive electronic apparatus is built, a particular advantageous arrangement can be created in which a data record can be completely transferred from the memory of the first apparatus into the memory of the second apparatus. This data transfer is even beneficially possible when the second apparatus is partially defective.

30 Claims, 4 Drawing Sheets

ELECTRONIC APPARATUS, PROCESS FOR ITS DUPLICATION, AND ARRANGEMENT FOR DATA TRANSFER BETWEEN TWO SIMILARLY CONSTRUCTED ELECTRONIC APPARATUS

BACKGROUND OF THE INVENTION

This invention concerns an electronic apparatus with a microprocessor or microcontroller, a non-volatile memory and an interface; a process for its duplication; and an arrangement for data transfer between two electronic apparatus.

An apparatus for continually monitoring operation of a motor vehicle is disclosed, for example, in German Industrial-Model Publication DE-U 88 16 458.

Other apparatus—for example for controlling purposes in vehicles such as motor vehicles, possibly for control of a drive line or for diagnostic purposes to determine maintenance intervals—have, until now, been used with their functions being determined by highly specialized structural conditions and specialized embodiments of coupled functioning units. Until now, different motor or drive embodiments have required different control apparatus, which, in view of logistics, has meant increased costs.

Thus, so called unit control apparatus have been increasingly developed, which can in principle, be used for a plurality of attached functioning units. An adaptation to a respective functioning unit is made by having changeable parameters. A setting of the Parameter is carried out either initially by a manufacturer of the electronic control apparatus or during a final mounting of the functioning unit, for example, of the drive line or the entire motor vehicle, that is, in an area of application.

In general, this is done by a calculating unit, for example a PC or workstation, initially transmitting parameter sets to the control apparatus via a computer interface. If, however, the apparatus later fails during a driving operation, an identical parameter set must be transferred to a replacement apparatus by a repair shop in the same manner. This means, however, that provisions must be made so that repair shops, when such needs arise, have available the appropriate original parameter sets, and this involves a substantial data-logistic expense.

An appropriate apparatus can, for example, also be provided for monitoring drive parameters in an arrangement in which these parameters are regularly recorded in a non-volatile memory by the microprocessor; for example, for an accident data recorder or for an electronic trip recorder of a vehicle. Yet other differently-made apparatus can, for example, be provided to make inspection intervals depend upon actual loads born by a vehicle or its components, which can considerably reduce expenses of high-cost inspections of large vehicles. For such an apparatus, for example, expended-kilometer status can be stored.

One can in this case indeed take care that, at regular intervals—for example during routine maintenances or when stopping for gas—the data is read out and stored in a stationary calculator. When needed, this "current" data set can be accessed. A logistical problem remains, however, because a failure of the electronic apparatus can happen at a completely different place than in the memory. Also, this data set is only relatively current, because the data set in the control apparatus can continually change. This is particularly true if parameter sets of an electronic apparatus are continually changed by adaptive adjustment, as in a brake control apparatus.

It is particularly troublesome if such an apparatus fails, or is so substantially damaged by outside influences, even though the non-volatile memory component is still intact, that the necessary data can no longer be accessed, or can only be access at great expense. Then the memory component can often not be easily removed because such apparatus are usually embedded or because the memory component is so tightly soldered as a SMD component that it can only be removed with utmost difficulty without damage.

If the stored data in one available apparatus is to be made identically available for use in a replacement apparatus, normally, specially-made diagnostic equipment is used, which, because of costs, is not found in every repair shop. This known equipment requires, however, that a microprocessor of the apparatus from which the data must be taken still functions properly. This functioning can only be guaranteed, however, if, in the concerned apparatus, all of the components which supply, or make available, an operating voltage to the microprocessor are still operational in all respects. Even if all of these requirements are met, a transfer of the data from one partially defective apparatus to a corresponding diagnostic apparatus, for example, and finally from the diagnostic apparatus to the replacement apparatus is associated with tremendous costs.

It is, therefore, an object of this invention to provide a particularly uncomplicated and cost-effectively-constructed electronic apparatus having a microprocessor or a microcontroller and a non-volatile data memory, which, when it fails and must be replaced, maintains logistics, time, and structural costs within limits. The ability to (still) use stored data in a similar apparatus is made possible at minimal costs.

SUMMARY OF THE INVENTION

The invention makes use of the knowledge that defects in electronic control apparatus almost always are caused by selective failure of individual elements, such as electronic components, galvanic couplings or mechanical components, and that only seldom is the actual data memory, which could be an EEPROM, Flash-EPROM or the like, actually damaged. In most cases the stored information is generally still retained. Only the path to this information is directly or indirectly blocked.

Therefore, it is suggested that an electronic apparatus, perhaps, a control apparatus, be constructed, with its hardware being so arranged, that control lines, data lines and power lines of a memory component not only lead to internal electronic elements of the control apparatus which cooperate with it—that is in any case to its microprocessor or microcontroller—but rather additionally also directly to, or via particular interface devices to, externally-accessible contacts, for example a plug unit; and that the memory component is, via this interface, also decoupled from the remaining electronic elements, externally supplied with current and driven or read. With little difficulty, it is made possible by coupling identical interfaces of first and second electronic apparatus with one another, and upon application of an operational voltage to the first apparatus, the contents of the non-volatile memory of the second apparatus is positively copied into the nonvolatile memory of the first apparatus.

By simply coupling the interfaces of the two similarly-constructed apparatus together, the data held in the non-volatile memory component of one of the apparatus can be thusly, easily transferred to the nonvolatile memory component in the other apparatus.

In this regard, it is particularly beneficial that in the apparatus from which data is to be read, substantially only the non-volatile memory, the interface and a valved line (with regard to its blocking function) need be operational, over which the memory is normally powered. Contrary thereto, the functioning ability of the microprocessor or the power supply elements of the concerned apparatus are completely unimportant. Particularly, the apparatus to be read from, can have a defective microprocessor.

It is also beneficial that the apparatus, whose memory is to be read from, can be, to the fullest extent possible, non-operational. It does not have to be powered from its own power supply. The cause of its failure can, therefore, be a significant central defect, such as a voltage regulator or a central filter or power supply. Only the non-volatile memory of the electronic apparatus, and perhaps a semi-conductor valve and a few leads at the interface, must still remain intact, with the interface being formed only by contacts.

After completion of the automatic readout of the data, the reading apparatus contains the complete data set of the read-out memory of the other apparatus, so that the reading apparatus can immediately be mounted as a replacement apparatus. Also, it can be provided that the data stored in the reading apparatus can be analyzed at another place, without the original apparatus being necessary for this.

A controllable switch arrangement can be provided to form a clearing circuit of those components which normally cooperate with the read-out memory component.

For such an enhancement, it has proven to be beneficial for the switched position of the switch arrangement to be controlled via a logic signal applied at the interface.

It is particularly beneficial for this signal from the one apparatus to be acquired by the other, similarly-constructed, apparatus via the power voltage applied to the interface. The one apparatus thus supplies power to the necessary components of the apparatus which will transfer the data—and, indeed, independently of whether the apparatus can still power itself with its own voltage supply terminal—and determines at the same time, by control of the switched position of the switch arrangement of the apparatus, that the apparatus is, upon data transfer, the data sending apparatus and that it itself is the data receiving apparatus.

A particularly uncomplicated construction of the switching arrangement and the interface of the apparatus of this invention is provided if the components have as signal lines respectively a single data line and one clocksignal line. The data transfer takes place in this case serially and synchronized. Of course, the invention includes also the possibility of an asynchronous and/or parallel data exchange, which, however, involves a more expensive structure of the apparatus.

Further, it is beneficial that the switching arrangement has two switching devices, namely: a first switching device which in a normal state couples the at least one signal lead of the microprocessor with that of its non-volatile memory, and upon activation, with that of the interface, with the active switched position of the first switching device being controlled by a voltage signal of the microprocessor; and a second switching device which makes it possible to couple the at least one signal lead from the non-volatile memory to the interface and at the same time to uncouple the at least one signal lead of the microprocessor from this component. This switched position depends upon a logic signal at the interface or also upon whether the switching arrangement (and the non-volatile memory) gets its operating voltage from an operational voltage supply via the interface or via its own operational voltage supply lead. In the first mentioned switched position the non-volatile memory can be read out via the interface.

Other embodiments of the invention which are also particularly beneficial are completely without such switching devices. These actively employ output isolation characteristics of more modern newer digital components upon failures of their power voltages, in combination with particular behaviors of microprocessors controlled by their boot programs in initializing phases. Hardware expenses are thereby reduced to an absolute minimum.

In a beneficial manner, the microprocessor recognizes during its initializing operation (so called booting), a hardware increase and subsequently employs this to effect a complete automation of data transfer, and parameter processing in relation to its non-volatile memory. In this regard, the breaking of the coupling between the two apparatus can be beneficially exploited to initiate a transfer of data, which is intermediately stored in the working memory (RAM) of the reading microprocessor from the read-out non-volatile memory of the other device, into the non-volatile memory of the reading device.

If a suitable apparatus with a microprocessor and non-volatile memory, with a suitable interconnecting circuit, is coupled from the outside to the interface of an apparatus to be programmed, or to be assigned parameters, the microprocessor of the latter positively seizes the memory in the apparatus to be replaced, or duplicated, and positively boots itself—depending upon programming and even using data stored there—until it has the ability to read, and then reads the data out. For example, one instruction or flag-bit originally stored in the non-volatile memory, and thereby read in, can be used, after a separation of the coupling between the two apparatus is carried out, to read back this data from a predetermined RAM area of the microprocessor into its non-volatile memory. This separation-initiated "reading back" in the apparatus supplied with current thus takes place, positively into its own non-volatile memory, which is thereby "copied over" to become a copy of the one that was read from.

The inventive electronic apparatus thus has the complete ability to take over program data as well as parameters—such as, for example, life span data—from a memory of another—to be duplicated—apparatus of the same type, whether this latter apparatus is operational or not. Also in cases where its functioning ability does not need the apparatus that is to be duplicated (as normally), it is supplied with current from an external power supply source.

According to one embodiment, the interface can, in addition to contacts, include cooperating devices which would make an unintentional and/or unauthorized access to it impossible.

According to one such embodiment, a housing of the electronic apparatus is structured, on the one hand relative to the interface (contacts and cooperative devices)—and vice versa—and on the other hand relative to a second identical apparatus and its interface (contacts and cooperation device) —and vice versa—, such that both interfaces can only be coupled by plugging the two apparatus together, to form a single one-body-functional arrangement for data transfer.

This detail is of great importance because it contributes to making an unauthorized regeneration of identical electronic apparatus by manipulation impossible, in spite of, or in light of, the extremely uncomplicated copyability of electronic apparatus according to this invention.

It is a further object of this invention to provide a process by means of which such a new, or at least a differently programmed, electronic apparatus can duplicate non-volatile stored data, and parameter sets, of a corresponding other apparatus.

This object of the invention can be attained in a surprisingly uncomplicated and beneficial manner using an embodiment of this invention.

Accordingly, in a first step, two apparatus A and B, with deactivated voltage supply terminals, are coupled together at their interfaces. If data is to be positively transferred from apparatus B into apparatus A, in a second step the normal operational voltage is applied to the voltage supply terminals of apparatus A; however, not to those of apparatus B. In a third step, a non-volatile memory component of apparatus A is at first positively deactivated by this current flow and the nonvolatile memory component of apparatus B is immediately positively activated. In a fourth step the microprocessor of apparatus A, recognizes by this immediate activation of a non-volatile memory component, that it is not its own, still-inactive, non-volatile, memory component, and, because of this, causes data stored in the non-volatile memory component of apparatus B to be read into its RAM area. In a fifth step one (the operator) waits until the microprocessor of apparatus A, upon completion of the readout operation, switches over to monitoring a signal level, which signal level, at the latest, is positively caused in a characteristic manner across the interface by apparatus B into apparatus A, in order to show the presence or non-presence of apparatus B to the microprocessor. In a sixth step, thence,—while the power supply is maintained to apparatus A—the electrical coupling is disconnected between the two apparatus A, B at the interface. In a seventh step an electrical separation is sensed, from the above mentioned level monitoring, and valued by the microprocessor of apparatus A as a "true" condition for a now-possible "writing back" of the data which was previously recorded by it in its RAM area into the only still-available non-volatile memory component, namely that of apparatus A. In an eighth step the writing of this data, which was initiated as previously mentioned, into the non-volatile memory component is completed and one (the operator) waits until this writing process is completed. Optionally, in a ninth step, one can wait until the microprocessor has been started again, and/or until the microprocessor has booted up the application of apparatus A and the apparatus has accordingly reached an operational condition. In an optional tenth step, during the above mentioned boot-up process of the application, the correctness of the data transfer that has taken place can be tested. In an optional eleventh step, completion and/or correctness of the data transfer can be recognized from the fact that apparatus A reaches its normal operational condition.

During this process, the data transfer will be completely and uncomplicatedly controlled by a quite simple expansion of the bootstrap of the microprocessor (expanded to include condition-dependent port polling).

All in all, the new apparatus A thus takes over the non-volatile stored data of the old apparatus B or the old apparatus B positively, further bequeaths its data to the new apparatus A. With regard to a vehicle, it is, for example, thusly guaranteed that the new apparatus A, with regard to stored vehicle parameters and life time data, has the same condition as did the old apparatus B. Thus, a seamless further operation results with accumulated parameters. Replacement logistics are no longer needed.

This process is impressive because of its unprecedented simplicity as well as because only a connection of the power voltage (on A or B) decides from which apparatus data is transferred into the respective other apparatus. The process of this invention is also quite well suited for cloning apparatus, with at least one single useful, or suitable, pattern apparatus being available.

It is further beneficial that two electronic devices constructed according to this invention can be easily coupled into one circuit arrangement with which a fully-automatic data transfer from a non-volatile memory of one of the apparatus into a non-volatile memory of the other apparatus can take place, whereby the direction of the data transfer can be determined easily and without confusion.

Such an arrangement can also provide a beneficial time-optimized data transfer process if the data is transferred from one apparatus to the other in blocks and the microprocessor, already during a writing time of a data block into its written-in non-volatile memory, is already reading the next data block from the read-out non-volatile memory.

Three embodiments of the invention are shown in the drawings and are described in detail below as follows.

DESCRIPTION OF THE PREFERRED EMBODIMENT

Figure 1:
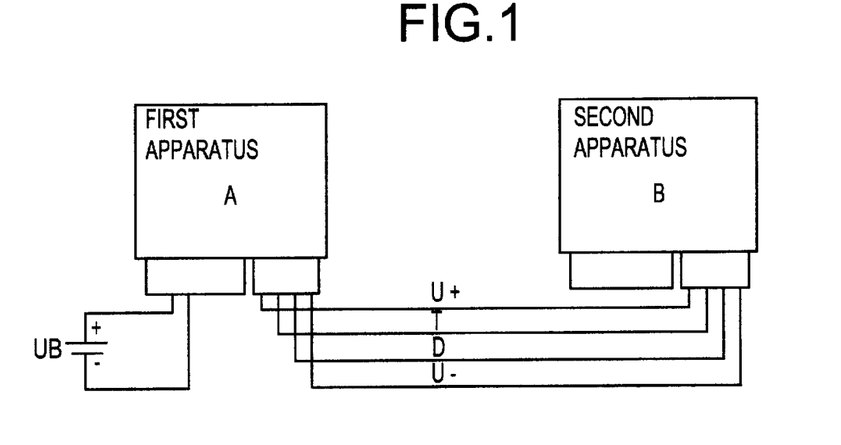
FIG. 1 a connection block circuit diagram of two electronic apparatus A and B prepared for data transfer—which also could be referred to as an arrangement for data transfer—, as is necessary to carry out the process of this invention.

FIG. 1 shows two control apparatus A and B according to this invention, which are coupled together and which are coupled with a power voltage source UB, for purposes of copying non-volatile stored data in apparatus A from apparatus B. Both apparatus have the same structure. It is significant that indeed apparatus A, which after the data transfer has taken place will be a duplicate of apparatus B (that is, if it has no defects), is coupled with the power voltage source UB, while the apparatus B, as the data source, does not have a power supply. The coupling of the two apparatus with one another takes place here, for example, via only four leads, namely: a conductor U+ to supply a positive voltage, from which the non-volatile memory in apparatus B is powered; a corresponding conductor U– which normally can have the function of a grounding conductor; a further conductor D for serially transferring data; and a further conductor T to transmit a clock signal, for a synchronized transmission for example.

This coupled circuit diagram is identically valid for the first two embodiments and can be logically modified also for the third embodiment, and it also represents an apparatus configuration for carrying out the process of this invention as well as a physical arrangement for the data transfer.

Figure 2:
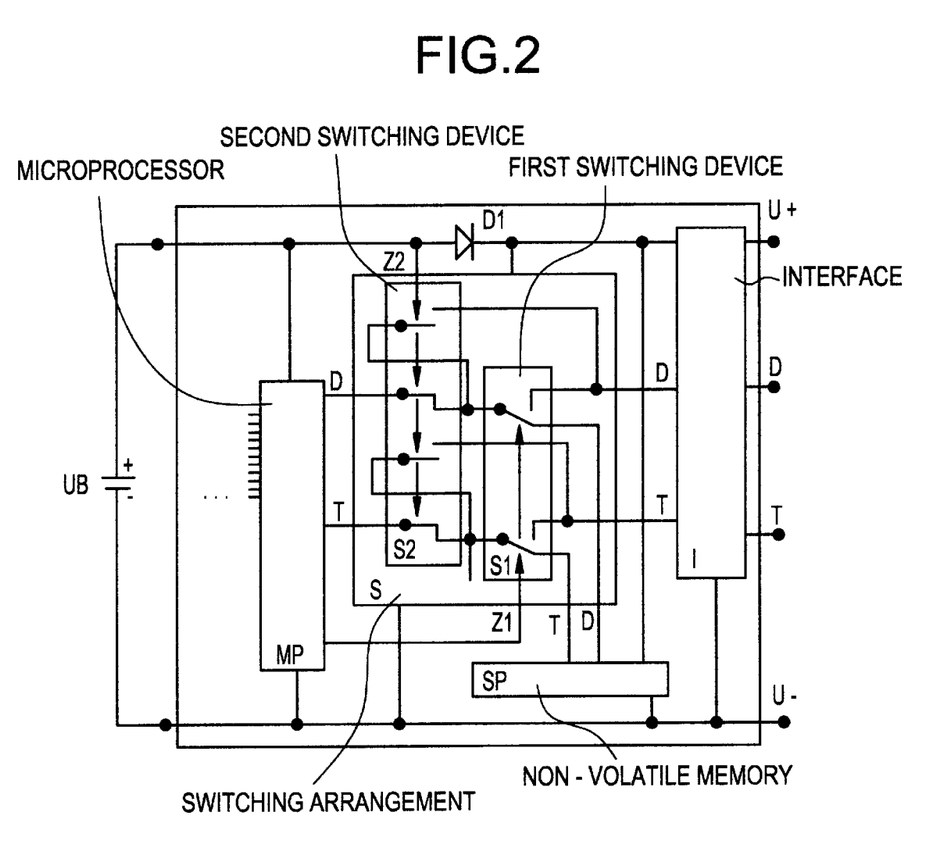
FIG. 2 a functional block circuit diagram of a first embodiment of an apparatus of this invention which employs a controllable circuit switch arrangement.

FIG. 2 shows a functional circuit diagram of a first embodiment example of an apparatus of this invention, in which, in this drawing, —in a simplified manner—only inventive circuit parts are shown. Components or sensors, for example, are not shown which provide signals or data to a microprocessor MP from which it in turn, generates data which it writes via the switch arrangement S, into a non-volatile memory SP. Further, all the rest of the components of the apparatus which also receive their operational energy from the voltage source UB are not shown.

The apparatus includes at least the following components: the microprocessor MP, the non-volatile memory SP and an interface I. Each of these components MP; SP; I has signal leads; in this embodiment each having the clock signal lead T for synchronization and the serial data lead D.

The Signal leads D, T of these components MP, SP, I are coupled together via the switch arrangement S whereby the switch arrangement can couple together the respective signal leads D, T from two of the respective three components MP, SP, I by means of a first switching device S1 and a second switching device S2.

A switched position of the first switching device S1 can be influenced by the microprocessor MP through a first access control lead Z1 which determines if it accesses to the non-volatile memory SP or to the interface I.

The switched position of the second switching device S2 is determined via a second access control lead Z2 and depends on whether the circuit is powered via its own voltage source lead from the power voltage source UB or whether, instead, is it powered from an external power voltage U+, U− via the interface I.

In this last case, only the switch arrangement S and the non-volatile memory SP are supplied by the external power voltage U+, U−. Because of a blocking diode DI no positive potential reaches the access control lead Z2 nor, because the microprocessor MP is also not supplied with voltage, also the access control lead Z1. In this manner, the switch arrangement S assumes a switched position in which it couples the non-volatile memory SP with the interface I whereby the non-volatile memory SP can be read over the signal leads D, T passing through the interface I (this switched position is shown in apparatus B of FIG. 3).

The interface I is made as a bi-directional driver circuit and has additionally a protection circuit for protecting the apparatus against damaging voltage influences.

The switch arrangement S can easily be made as a commercially available integrated analog switch or as a tristate logic gate arrangement.

FIG. 2 shows the switch arrangement S in a normal position, in which the signal leads D, T of the microprocessor MP are coupled with those of the non-volatile memory SP and the microprocessor MP accesses the non-volatile memory SP for reading and writing.

The electronic apparatus represented in FIG. 2, makes possible, in a particularly good manner, a data transfer, to a similarly-constructed apparatus. The general circuit diagram of an arrangement that is suitable for this, is shown in FIG. 1.

Two identical or similarly constructed apparatus A, B, are coupled together through their interface leads U+, U−, D, T. Only the apparatus A is coupled to the voltage source UB. Those components of the apparatus B necessary for transmitting the data are furnished with power voltage U+, U− of the apparatus A through the diode DI, the interface I and the interface leads U+ and U−.

By means of this coupling it is simultaneously determined that the apparatus A has been actively made the data transfer controlling device which reads the data in, and that the apparatus B has been made the device which is to be read from.

Figure 3:
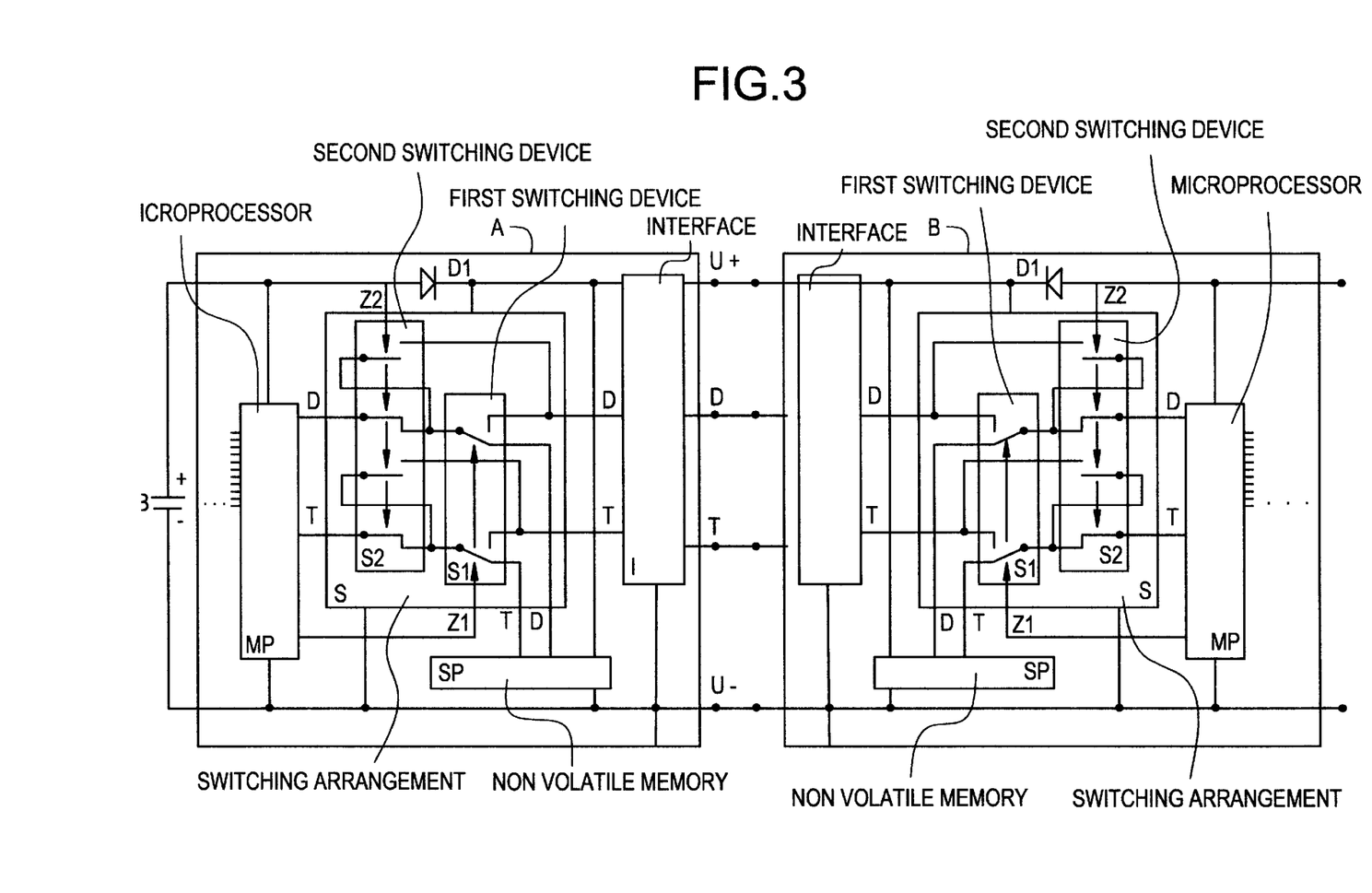
FIG. 3 a block circuit diagram of a more detailed example of the connection of FIG. 1, using, basically, the functional circuit diagram of FIG. 2.

The arrangement to transmit the data between two electronic apparatus is shown in more concrete terms in the block circuit diagram of FIG. 3. It can be seen herein that the two apparatus A, B are coupled together as mirror images at their interface leads U+, U−, D, T.

Both apparatus A, B are similarly structured; and insofar as they differ from one another then only as to component groups that are not shown in FIG. 3. For purposes of simplicity, the like components of each apparatus are respectively identified by the same reference numerals.

The power voltage source UB supplies power to various components, MP, SP, I as well as also to the switch arrangement S of the apparatus A and also sets an access control lead Z2 at a positive potential, whereby the switching device S2 of the apparatus A is placed in the position shown in the drawing in which the signal leads D, T of the microprocessor MP are coupled to the first switching device S1.

The supply voltage UB reaches further, —via the diode DI and the interface I of the apparatus A and the interface leads U+, U− as well as via the interface I of the apparatus B—also to the voltage terminals of the non-volatile memory SP and the switching arrangement S of the apparatus B.

A positive potential does not pass through the blocking diode DI to the access control lead Z2 and also not to the microprocessor MP of the apparatus B, and therefore also it does not reach the access control lead Z1 of the apparatus B. Because of this, the switching arrangement of the apparatus B is positively moved into the switched position depicted in FIG. 3 in which the signal leads D, T of non-volatile memory SP are directly coupled with the interface I of the apparatus B. Thus, also the interface I of the apparatus A has a direct coupling to the signal leads of the non-volatile memory SP of the apparatus B over the interface leads D, T. The microprocessor MP of apparatus A controls now, via the access control lead Z1, the first switching device S1 to respectively alternate between a switched position in which the signal leads D, T of the microprocessor MP are coupled with the interface I, so that the microprocessor MP can read data coming from the interface I and a switched position in which the signal leads D, T of the microprocessor MP are coupled with the non-volatile memory SP of the apparatus A, whereby the microprocessor MP writes this previously read data into this nonvolatile memory SP.

Thus, in an uncomplicated manner, the complete data set which is held in the non-volatile memory SP of the apparatus B is copied into the non-volatile memory SP of the apparatus A. After completion of this process, the apparatus A can be simply employed as a replacement apparatus for a possibly partially defective apparatus B.

Figure 4:
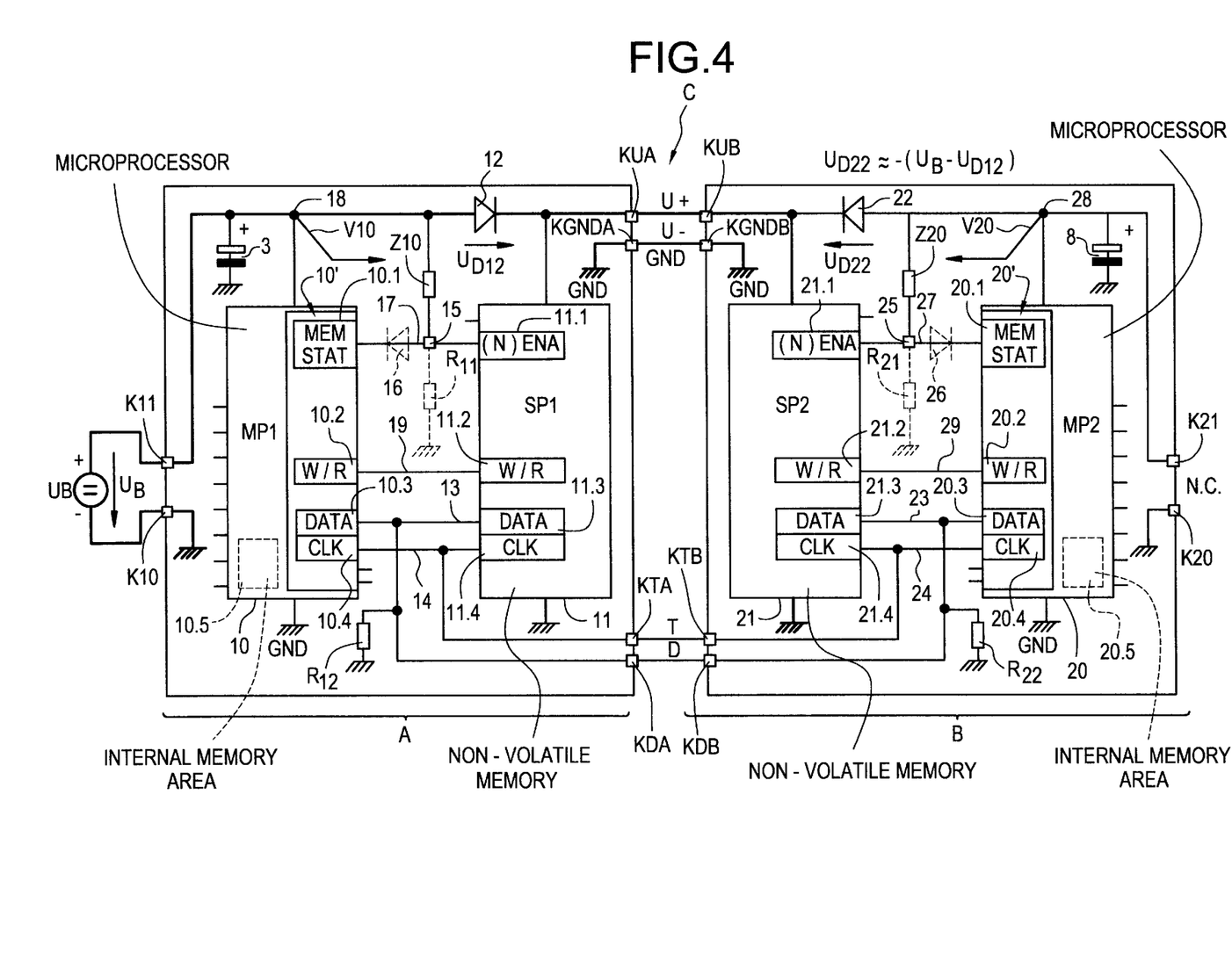
FIG. 4 a block diagram of another concrete example of the connection circuit of FIG. 1, basically employing a functional circuit of a second embodiment which operates without a controllable switch arrangement.

According to a second embodiment shown in FIG. 4, two identical, with regard to their non-volatile memory arrangement, apparatus A, B each respectively has a microprocessor or microcontroller 10, 20 with ports (input and output) 10', 20' in "Advanced "Tristate" or "Power-Activated-Port-Technology". Among other things there are provided here, relative to 10', 20' respectively, a bi-directional port 10.1, 20.1 (MEMSTATUS; MEMSTAT); a read/write control output 10.2, 20.2 (WRITE/READ; W/R); a bi-directional data port 10.3, 20.3 (DATA); and a clock output 10.4, 20.4 (CLOCK; CLK). The microprocessor or microcontroller 10, 20 respectively, further has an internal memory area 10.5, 20.5, which beneficially includes a RAM and ROM to store at least a root segment of its boot program. In order to avoid misunderstandings, at this point it is pointed out that in the entire following description, the term "microprocessor" can also be replaced by the term "microcontroller", the latter of which, as is set forth in literature, has analog as well as digital inputs and/or outputs and the A/D and D/A conversion capabilities necessary for this.

Without limiting its universality, the microprocessor or microcontroller 10, 20 can also copy with external RAM and/or ROM components; however, for simplicity sake, these are not shown in the drawings. The respective structure of the apparatus A, B depends in each case on its use, the circumstances of the program used and the microprocessor used. If, in the following, reference is made to RAM/ROM of the microprocessor or microcontroller, it should be understood that in this invention internal and/or external memory can be used.

The apparatus A and B each respectively, further has a non-volatile memory element 11 and 21 with each having an inhibit, or disable, input 11.1, 21.1 (NOT ENABLE; NENA) in appropriate technology (dependent on the logic, this input 11.1, 21.1 can also be an enable-input (ENABLE; ENA), for example for negative logic, thus, the input is identified in the drawing by (N)ENA). Each memory component 11, 21 respectively has, in addition to the already described input 11.1, 21.1, a further input 11.2, 21.2 (WRITE/READ; W/R), a bi-directional dataport 11.3, 21.3 (DATA; DATA)and a clock input 11.4, 21.4 (CLOCK).

The ports effectively connected together are: the ports 10.1 and 11.1 via point 15 by a line 17; the ports 20.1 and 21.1 via a point 25 by a line 27; the ports 10.2 and 11.2 by a line 19; the ports 20.2 and 21.2 by a line 29; the ports 10.3 and 11.3 by a data line 13; the ports 20.3 and 21.3 by a data line 23; the clock ports 10.4 and 11.4 by a clock line 14; and the clock ports 20.4 and 21.4 by a clock line 24.

The respective ports 10', 20' of the respective microprocessors 10, 20 distinguish themselves as "advanced tristate" or "power-activated port-technology" in that they also, upon a failing power voltage $U_B$, in a defined manner, are high-ohmig and provide an effectively negligible load. Each of the non-volatile memory components 11 and 21 is structured so that its clock and data inputs and outputs, in inhibited or disabled conditions have high resistances and also present negligible loads.

Exactly as in the first embodiment, also here each of the memory components 11, 21 is not connected directly to an apparatus internal supply voltage rail 18, 28, but rather is coupled to this via a series-connected valve 12, 22, poled in a supply current direction, which here, for simplicity, is coupled directly with a supply terminal K11, K21 of the apparatus A, B, and supported by an energy storage (condenser)3, 8 (normally, a voltage regulator can, of course, be positioned between the energy storage 3, 8 and the terminal 11, 21; however, this detail is not important here). An operational power supply from each of the supply voltage rails 18 and 28 is respectively provided, in addition to the respective microprocessors 10, 20, also to additional components of each of the apparatus A and B respectively, via the branch supply lines V10, V20.

A resistor or a current source Z10, Z20 can be coupled to the supply voltage rail 18, 28, with its other side coupled to the above mentioned respective point 15, 25, and thus with the (N)ENA-input 11.1, 21.1 of the memory component 11, 21. From each of the points 15 and 25 a further optional resistor $R_{11}$ and $R_{21}$ (preferably relatively high ohmic) can be coupled to a chassis ground. As an example, here still a further resistor $R_{12}$, $R_{22}$ (also relatively high ohmic in practice) is respectively coupled from the data line 13, 23 to ground GND.

The described effective connections between the ports 10.1 and 11.1 and 20.1 and 21.1 can be realized by a direct lead path or over a further valve 16, 26, which is poled relative to its current direction so that the respective microprocessor 10, 20 can internally switch the respective input 11.1, 21.1 of the appropriate memory component 11, 21 to chassis ground GND.

In each of apparatus A and B, the supply terminal of the memory component 11, 21, the apparatus chassis ground GND, as well as connections with the respective data lines 13, 23 and clock lines 14, 24 are connected to the appropriate contacts KUA, KUB and KGNDA, KGNDB and KDA, KDB and KTA, KTB.

For purposes of transferring data, each of the respective first mentioned contacts of the apparatus A are coupled together with the respective second mentioned contacts of the apparatus B (for replacing or for copying or for reproducing), either directly or by means of a special coupling cable or adapter C, which respectively here has, for example, four paths U+, U–/GND, T and D.

Contrary to the first embodiment, here no electronic interface component is provided.

This can be quite beneficial because not only some defect in apparatus B can make the reading of data from the still intact non-volatile memory SP or 21 of the apparatus B into the apparatus A impossible, but strictly speaking, a serious defect in a normally-created interface component I according to the first embodiment can do this as well.

Within this invention, instead of that, the apparatus A and B can be so custom constructed, particularly with regard to the shapes of their physical interfaces, and especially their contacts with regard their shapes relative to one another and their accessibility such that two such apparatus A and B, can be also, or can only be exclusively coupled or plugged to one another at their interfaces—either by means of a very specialized adapter (for example in the form of an intermediate plug module or copier cable)—and then only directly. Preferably, such an appropriate adapter contains no active semiconductor components; if need be, in particular cases, there can be voltage limiting protection elements as desired.

The invention includes in this regard also the idea that the interface can include, in addition to simple contacts—such as KUA, KGNDA, KTA, KDA; possibly also KCA—a cooperative device which makes impossible unintended or unauthorized access to the latter. This device can be mechanical and/or made as one piece with the housing of the apparatus. With regard to this, the invention further includes that the electronic apparatus A has an outer housing which is constructed such that, on the one hand, with regard to its interface (that is contacts KUA, KGNDA, KTA, KDA, and possibly also KCA and the cooperative device, —and vice versa—, and on the other hand, in relation to the second identical electronic apparatus B and its interface, (including contacts KUB, KGNDB, KTB, KDB, possibly also KCB and the cooperative device—and vice versa—, both interfaces are only coupleable, with each other, and then only by plugging the apparatus A and B together, that is at one and the same place, to form a single, one-body functioning, arrangement for transferring data between them.

Without limitation to the generality, such a construction, however made, as well as possibly also outer shapes of housings of the two identical apparatus A and B cooperating therewith, and relative to one another, fall within this invention.

Such an embodiment not only makes impossible, or at least more difficult, an unintentional damaging of the electronics of the apparatus A and B by unintentional actions, particularly to the contacts KTA and KTB as well as KDA and KDB. It also makes manipulations and misuses more difficult in a very effective manner.

Each of the apparatus A and B functions independently of, but in connection with, the respective other apparatus as follows:

The resistance, or the current source, Z10, creates, immediately after the supply voltage $U_B$ is applied on the terminal K10 and K11, a level "HI" at the input 11.1 of the memory component 11, which initially blocks the memory component 11 and at least one of its ports 11.3 (bi-directional data port) and 11.4 (clock input) is switched to have a high resistance. Thus, for example, the data port 11.3 —which is coupled to the high ohmic resistance $R_{12}$—achieves a logical level "L".

Normal Operation of the Respective Apparatus A and B individually

In normal operation—without the apparatus B—, the ROM-bootstrap of the microprocessor 10 monitors its port 10.1 for the level "HI" and monitors also, in conjunction therewith, for example, the above mentioned initial level "L" at its data port 10.3, that is, whether the data line 13 is switched to be free. This is done, for example, by emitting a test signal on its data port 10.3. A corresponding positive monitoring is interpreted by the microprocessor as "normal operation".

(The ROM-bootstrap is at least a part of the initializing software of the microprocessor in this respective apparatus application which uses the ports, that is the inputs and outputs of the microprocessor, for monitoring).

Naturally, there can be a suitable programming of the bootstrap of the microprocessor so that the clock output 10.4 can carry out an appropriate alternative or additional inquiry at its clock output 10.4, particularly if a bi-directional port of the microprocessor is used for this.

If the microprocessor 10 recognizes that the line 13 is switched to be free (and/or the line 14) (that is that 10.1="H" and/or 10.3 or 10.4="L"), the microprocessor 10 recognizes therefrom that there is a "normal condition" and brings its MEMSTAT-Port 10.1 to the level "L", whereby firstly the non-volatile memory 11 is activated and secondly a further booting is caused, using access to this memory 11, until the microprocessor 10 has loaded the complete apparatus application, and normal operation of the apparatus A has begun. A corresponding operation is true for the apparatus B in an opposite manner when viewed alone, if it is not defective.

Clone Operation "Duplicating B".

In order to transmit the data from the non-volatile memory of the apparatus B into the non-volatile memory of the apparatus A, both of these are coupled together as shown in FIG. 1.

As can be seen in FIG. 4 in detail, the contacts K20 and K21 of the apparatus B remain uncoupled, while an operation voltage $U_B$ is placed on the contacts K10 and K11 of the apparatus A. Without operation voltage on the contacts K20 and K21, because of a blocking by the valve 22, the supply rail 28 can be viewed as being attached to chassis ground, the memory 23 as being not loadable and, for example, even as having a short circuit, insofar as apparatus B is no longer functional.

Upon application of the operation voltage $U_B$ on the terminals K10 and K11, the apparatus A, including its nonvolatile memory component 11, and the non-volatile memory component 21 will be supplied with an operation voltage U+ =($U_B$-$U_{D12}$) via the valve 12 in the apparatus A.

The resistor, or current source Z10, effects in this case, immediately after the operation voltage $U_B$ is applied to the terminals K10 and K11, a level "H" at point 15 and thereby at input 11.1 of the memory component 11, whereby this, as previously described, is initially blocked and its ports 11.3 and 11.4 are switched to have high resistances.

In apparatus B the resistor, or the current source Z20, cannot however lift the point 25 to the level "H" because the supply rail 28 is at GND (because $U_{D22}$=-($U_B$-$U_{D12}$). The (N)BNA-input 21.1 of the memory component 21 is, however, at level "L"; that is, the memory component 21 is continually activated. Its data line 23 and clock line 24, however, are galvanically coupled via appropriate interface paths D and T respectively with the corresponding data line 13 and clock line 14 in apparatus A. Because the microprocessor 20 is not supplied with current, its W/R output 20.2 cannot bring the W/R input 21 of the memory component 21.2 to a level "H", which corresponds to a prearranged control for controlling the memory component 21 to read out.

Also here, the microprocessor 10 first inquires for the level "H" at its MEMSTAT-Port 10.1 and monitors thereafter, or in conjunction therewith, the free switched position of its ports 10.3 and/or 10.4 as a prerequisite for carrying out the above described further normal booting up of the application of the apparatus A.

Because the memory 21, however, is switched to be active, the result of this polling is negative. The microprocessor 10 interprets this result as instructions to discontinue its normal booting routine in order to overwrite current data in the non-volatile memory component 11 with data from the/an external non-volatile memory component 21 (go to a clone subroutine in the bootstrap of the processor).

Accordingly, the microprocessor 10 does not place its port 10.1 at the level "L", thereby further maintaining the deactivated state of the memory component 11; breaks off the normal booting process at an achieved condition of being able to read in and out; and reads at least the data content, of the memory component 21 into its RAM.

The original programming of each non-volatile memory component 11, 21, etc., can provide for a last read bit to be, for example, the level "H" (flag-bit). By this it can be achieved that the data line 23, at the end of the readout, transmits the level "H" (last bit latch).

After the close of the readout, the microprocessor 10 is held by its bootstrap at, and in, a monitoring program loop for a level on its dataline 13. At this point in time the interface coupling through C can be disconnected, that is the apparatus A and B can be electrically separated from one another.

This separating process is used for initiating a writing of the data read into the RAM of the microprocessor into the non-volatile memory component 11 as follow.

As a consequence of the separation, the data line 13, because of the resistor $R_{12}$ in each apparatus, goes to a level "L" because, still, 10.1="H", that is, the example port 11.3 of the memory component 11, as it was before, remains at a high resistance.

The microprocessor 10 recognizes this still-appearing "H–>L"-Transition (data-excess-flank) on its data line 13 upon completion of the reading in, and sees it (them) as the instruction "write the read in data back into the nonvolatile memory component"; accordingly, it sets its MEMSTAT-Port 10.1 to "L" and its W/R-output 10.2 to "H", it activates thereby the memory component 11 to read in the data which was previously read into its RAM and it thereby gives this data via the line 13, to the data port 11.3 of the memory component 11.3. Upon completion of this operation, the memory component 11 has the same data content as did the read out component 21 and the microprocessor sets its W/R-output 10.2 again at the level "L" (read).

Optionally, it can be provided in the boot program of the microprocessor 10 that, at the end, it starts itself again. Still further, it can be optionally provided that the microprocessor 10, upon this new start, boots up the application in a completely normal manner from the memory 11. This is, without doing anything else, possible, because at the point in time in which the new start takes place the apparatus B is no longer available and, thus the "normal operation" relationships described above exist.

Without additional structure, merely by the apparatus A reaching normal operational readiness, the completeness of the copying process can be recognized and, depending upon features of the boot program of the microprocessor, possibly even the "mistake-free nature" of the resulting data transfer can be recognized.

The embodiment of the invention described up to this point employs a synchronized data transfer and has only four line connections U+, U−/GND, T and D at the interface. It is also possible here to have a modified arrangement employing asynchronous operation, which, however, requires greater expenses.

Figure 5:
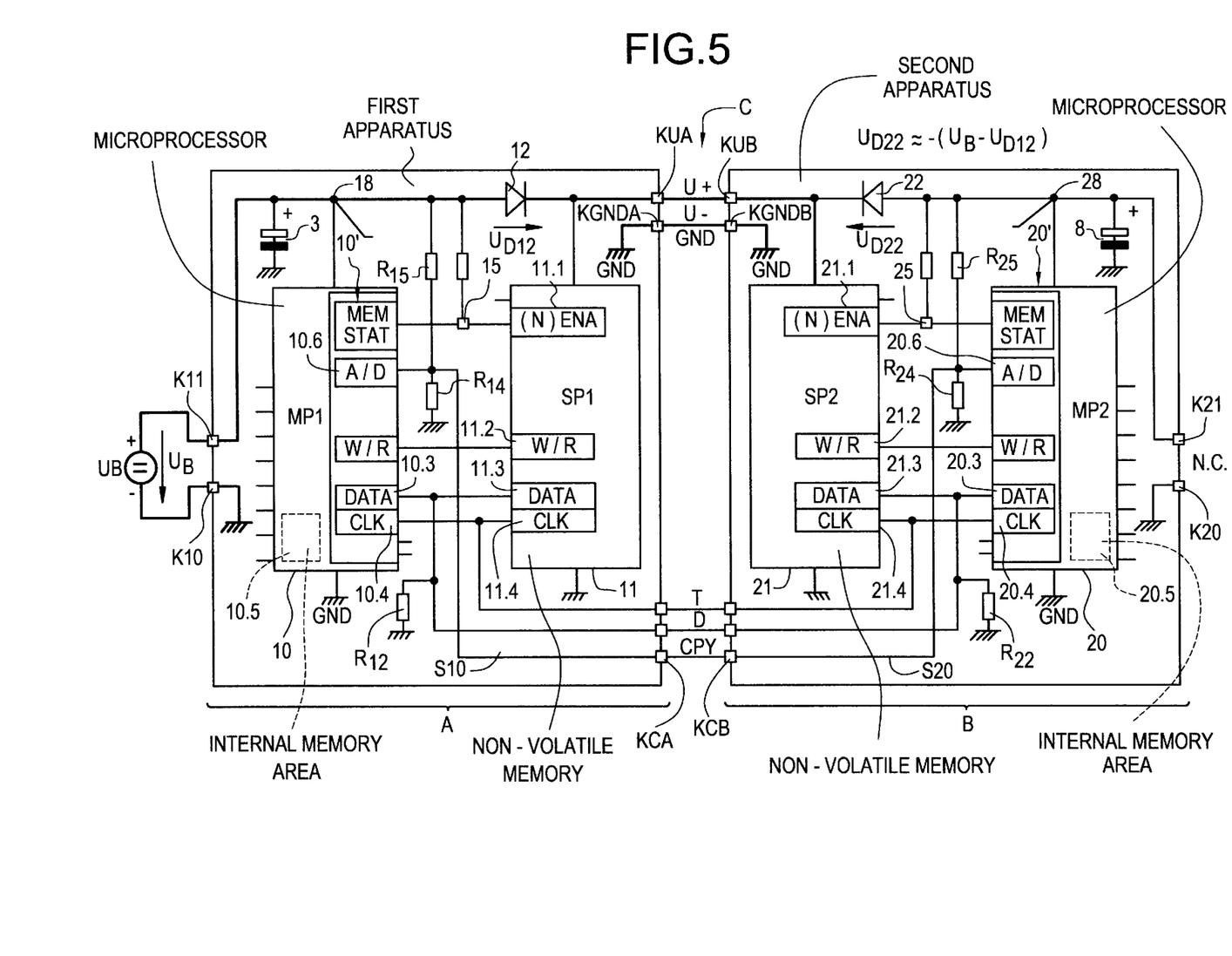
FIG. 5 a block diagram of a further concrete example of the FIG. 1 connection circuit, based on a modified functional circuit, contrary to FIG. 4, of a third embodiment which makes possible a particularly uncomplicated solution in cases where an A/D microcontroller is used.

A simplification results if, according to FIG. 5, a fifth coupling path CPY (for COPY) is provided at the interface and the microprocessor used, for example, is one which already has an integrated A/D-converter (microcontroller). By doing this, a simplification results so that less attention must be given to programming the bootstrap.

In an appropriate apparatus A, B, there can be a voltage divider made of two series-connected resistors $R_{14}$ and $R_{15}$ between the supply rail 18, 28 and GND respectively, with its midpoint being coupled, on the one hand, to a corresponding A/D input 10.6, 20.6 of the appropriate microcontroller 10, 20 in the respective apparatus A or B and, on the other hand, via a path S10, S20, to a corresponding fifth contact KCA, KCB at the interface.

If, for example, the resistors $R_{14}$ and $R_{15}$ have the same ohmic value, a voltage of $U_{R14}=½U_B$, relative to chassis ground, appears at the midpoint in apparatus A, upon an apparatus B not being present which, falls in a programmed, first-value±15% tolerance-range window for $½U_B$, for example. A presence of a voltage $U_{R14}$ in this value window, is interpreted by the microcontroller 10 as a true condition "B not present".

Under these same conditions, if the described midpoint has the relatively small voltage $¼U_B$ relative to GND as appears at the interface of the two inter-attached apparatus A and B across the paths CPY and U−/GND, because of a not-present current supply of apparatus B, it falls into a programmed second-value±15% tolerance-range window of $¼U_B$. The voltage $¼U_B$ results because supply rail 28 of the unpowered apparatus B lies at a virtual GND; that is, the resistors $R_{24}$ and $R_{25}$ appear to be connected in parallel to the identical resistor R14, from which a partial relationship of (⅓)/(⁴⁄₃)=¼ results. Presence of the voltage $U_{R14}$ in the above mentioned value window will be interpreted by the microcontroller 10 as a true condition "B present".

In the above case, the microcontroller can only set its MEMSTAT-Port at the level "L", to thereby activate the memory component 11, once it has found the true condition in the first voltage window, which, however, is only possible after a breaking of the interface path CPY. A monitoring of the datapath D after the data has been read into the RAM area of the microcontroller 10 can be eliminated here be as can also the Last-Bit-Latch-ability of the memory components 11 and 21 in activated condition after a clock pulse stop.

The second and third embodiments are obviously alike in that a monitored signal level appears at a switching arrangement in the data-transfer target apparatus whereby this level—at the latest after the data has been read from the source memory of the apparatus B—is characteristically changeable by the latter, independently of whether the apparatus B is defective or not.

From the functions of the second and third embodiments, along with conversion possibilities already described, one of ordinary skill in the art can understand an extremely beneficial processes in application for duplicating an electronic apparatus B, having a microprocessor and a non-volatile memory, in a corresponding apparatus A as follows:

In a first step, two non-powered ($U_B$=zero) apparatus A and B are coupled with one another (plugged together) at their interfaces, that is, at least KUA and KUB, KGNDA and KGNDB, KTA and KTB, as well as KDA and KDB are coupled to one another (U+, U−/GND, T, D). Their normal supply terminals are without power.

If data is to be transferred from apparatus B into apparatus A, in a second step the apparatus A will be powered at its normal supply terminal with its normal supply voltage; however, the apparatus B will not. Its supply terminals will remain preferably free, however they could also be short circuited.

In a third step, the non-volatile memory component 11 of the apparatus A is initially, positively deactivated by being powered and the non-volatile memory component 21 of the apparatus B is immediately positively activated.

In a fourth step, the microprocessor of the apparatus A recognizes, by immediate activation of a non-volatile memory component, that it is not its own inactive nonvolatile memory, and, as a result, it is caused to read the data of the non-volatile memory component of apparatus B into its own RAM area.

In a fifth step, one (an operator) waits until the microprocessor of the apparatus A, after completion of this reading-out process, changes over to monitoring a signal level, which signal level (at the latest) is positively caused, in a characteristic manner, via the interface, from apparatus B into apparatus A in order to thereby show the microprocessor the presence, or nonpresence, of the apparatus B.

In a sixth step thereafter—while the current supply is maintained to the apparatus A—the operator will break the electrical coupling of the two apparatus A and B at their interfaces.

In a seventh step this electrical separation will, because of the previously mentioned level monitoring, be sensed and be interpreted by the microprocessor of the apparatus A as a true condition for the now possible reverse writing of the data, which was previously read into its RAM area, into the only still available non-volatile memory component, namely that of apparatus A.

In an eighth step, initiation of the writing of the data into the above mentioned non-volatile memory component is initiated, carried out, and awaited by the operator until this writing process is completed.

Optionally, in yet a ninth step, this awaiting can continue until the microprocessor has started anew and/or until the microprocessor has booted up the apparatus A in a normal manner and the apparatus has reached its normal operating readiness.

During this process, the data transfer process is controlled in a quite uncomplicated manner, by means a simple, few-program-step expansion of the boot strap of the microprocessor (expanded to carry out condition-dependent port polling).

In this regard, at least a part of the bootstrap of the microprocessor can be stored in the non-volatile memory component, so that this part will also be respectively transferred, 1 to 1, into the new non-volatile memory component, whereby it is not lost and it can be used for an automatic validity test of the completed data transfer.

In this case, at least one (another) part of the bootstrap can also be stored in a particular ROM portion (10.5, 20.5) of the microprocessor which can be an integrated portion of the microprocessor.

For that matter, there can also be a tenth procedural step during the above mentioned "boot up" process of the application in which, also the validity of the data transfer which has taken place can be tested.

Finally, in still an eleventh step, from an achieved operation readiness of the apparatus A itself the completeness and/or validity of the resulting data transfer from the non-volatile memory 21 of the apparatus B into the non-volatile memory 11 of the apparatus A can be recognized.

Overall, the new apparatus A takes over the nonvolatile data stored in the old apparatus B, or the old apparatus B positively "bequeths" its data to the new apparatus A. With regard to vehicles, it is, for example, guaranteed that the new apparatus A, with regard to stored vehicle parameters and life-span data, is in absolutely the same condition as was the old apparatus B. Thus, there can be a seamless further operation with the accumulated parameters, without the expense of exercising great care in restart phases. Replacement logistics is no longer necessary.

An electronic apparatus of this invention and the process of this invention, can also be beneficially used to identically manufacture apparatus in any desired amount in an uncomplicated manner. Also, there is the possibility, for example, of adjusting, on a production line, previously virgin apparatus—or apparatus, previously already programmed for another purpose—for a new application use, possibly for an updated use, or vehicle model or series change.

Reference Numeral List
Electronic Apparatus, Process For Its Duplication, And Arrangement For Data Transfer Between Two Similarly Constructed Apparatus

| | |
|---|---|
| A | first apparatus |
| B | second apparatus |
| D | data path or lead |
| DI | diode |
| I | interface |
| MP, MP1, MP2 | microprocessor, microcontroller |
| S | controllable switch arrangement |
| S1 | first switching device |
| S2 | second switching device |
| SP, SP1, SP2 | non-volatile memory |
| T | clock signal path or lead |
| UB | power voltage source |
| U+, U− | power voltage source (externally supplied) |
| Z1 | access control lead (on the first switching device) |
| Z2 | access control lead (on the second switching device) |
| Z10, Z20 | resistor, current source |
| 10, 20 | microprocessor, microcontroller |
| 11, 21 | non-volatile memory component |
| 12, 22 | diode (supply valve) |
| 13, 23 | data line | in apparatus A, B |

-continued

| | | |
|---|---|---|
| | | respectively |
| 14, 24 | clock line | in apparatus A, B respectively |
| 15, 25 | coupling point | |
| 16, 26 | valve, for example, diode | |
| 17, 27 | memory status line | |
| 18, 28 | supply rail | |
| 19, 29 | write/read control line | in apparatus A, B respectively |
| 3, 8 | energy storer | in apparatus A, B respectively |
| KUA/KUB | interface contact U+ | in apparatus A, B respectively |
| KGNDA, KGNDB | interface contact U−/GND | in apparatus A, B respectively |
| KTA, KTB | interface contact clock | in apparatus A, B respectively |
| KDA, KDB | interface contact data | in apparatus A, B respectively |
| KCA, KCB | interface contact COPY | in apparatus A, B respectively |
| $U_B$ | supply voltage | |

Combination Reference Numbers

| | |
|---|---|
| MP, Mp1, MP2, SP, SP1, SP2, I | components |
| D, T | signal lines |
| U+, U−, U−/GND, D, T, CPY | interface paths and leads respectively |
| C | interface path realized (materialized or not materialized) |
| KUA, KGNDA, KTA, KDA (, KCA) | interface |
| KUB, KGNDB, KTB, KDB (, KCB) | interface |
| N.C. | meaning "no connection". |

The invention claimed is:

1. An electronic apparatus (A) including a microprocessor (MP; MPI, 10), a non-volatile memory (SP; SP1) and an interface (I; KUA, KGNDA, KTA, KDA, KCA), said interface being adapted to be coupled with a second interface (I; KUB, KGNDB, KTB, KDB) of a second electronic apparatus (B) which is substantially identical in structure to said electronic apparatus (A);

wherein, said electronic apparatus (A) includes an energy supply circuit for: distributing an intrinsic operating voltage, obtained by said electronic apparatus (A) independently of the interface, to the microprocessor, the non-volatile memory and the interface; and, distributing an external operating voltage received from said interface to the non-volatile memory;

wherein said electronic apparatus (A) further includes a data transfer circuit for: retrieving data from a second non-volatile memory of said second electronic apparatus (B) when the second electronic apparatus (B) is coupled to said interface and powered by said intrinsic operating voltage across the interface; and transmitting data from the non-volatile memory to said substantially-structurally-identical electronic apparatus (B) across said interface when said electronic apparatus (A) receives said external operating voltage from said second electronic apparatus (B) across said interface;

whereby, said electronic apparatus (A) can be coupled to said second electronic apparatus (B) at said interface, can distribute said intrinsic operating voltage to said second non-volatile memory of said second electronic apparatus (B) across said interface for powering said second non-volatile memory, and can retrieve data from said second non-volatile memory to thereby become a replacement electronic apparatus for said second electronic apparatus (B).

2. The electronic apparatus as in claim 1 structured such that when it receives the external operating voltage from the second electronic apparatus (B) across the interface, a data contents of the non-volatile memory (SP; SP1) of the first apparatus (A) is automatically copied into the second non-volatile memory (SP; SP2) of the second electronic apparatus (B).

3. The electronic apparatus of claim 1 wherein said data transfer circuit includes a controllable switching arrangement (S) and wherein there is at least one signal lead (D, T) from each of the microprocessor, the non-volatile memory and the interface (MP, SP, I) which is coupled with the controllable switching arrangement (S), and wherein:

the controllable switching arrangement (S) has a plurality of switched positions so that any two respective signal leads from the respective microprocessor, non-volatile memory and interface (MP, SP, I) can be coupled to one another; and wherein the controllable switching arrangement (S) can be controlled via signals received from the second electronic apparatus across the interface (I) into a switched position in which the switching arrangement (S) couples the at least one signal lead of the non-volatile memory (SP) with the at least one signal lead of the interface (I).

4. The electronic apparatus according to claim 3 wherein said switch is structured such that a logic signal applied to the interface (I) by the second electronic apparatus controls the switching arrangement (S) into a switched position in which it couples the at least one signal lead (D, T) of the non-volatile memory (SP) with the at least one signal lead (D, T) of the interface (I).

5. The electronic apparatus as in claim 3 wherein the external operating voltage (U+, U−) applied to the interface (I) by the second electronic apparatus controls the switching arrangement (S) of the electronic apparatus (A) into the switched position in which it couples the at least one signal lead (D, T) of the non-volatile memory (SP) with the at least one signal lead (D, T) of the interface (I).

6. The electronic apparatus according to claim 3, wherein:

each of the microprocessor (MP), the non-volatile memory (SP) and the interface (I) has only one serial data line (D) and one clock signal line (T).

7. The electronic apparatus as in claim 3, wherein:

the switching arrangement has a first switching device (S1) to switch the at least one signal lead (D, T) of the microprocessor (MP) between the at least one signal leads of the non-volatile memory (SP) and the at least one signal lead (D, T) of the interface (I), this first switching device (S1) being controlled by the microprocessor (MP) via an access control lead (Z1) connected between the microprocessor (MP) and the first switching device S1.

8. The electronic apparatus as in claim 7, wherein:

the switched position of the first switching device (S1) when the microprocessor (MP) does not having a voltage supplied thereto makes possible a coupling of the at least one signal lead (D, T) of the interface (I) with the at least one signal lead of the non-volatile memory (SP).

9. The electronic apparatus as in claim 3, wherein:

the switching arrangement (S) has a second switching device (S2) which makes possible a switching of the at least one signal lead of the interface (I) between the at least one signal lead of the microprocessor (MP) and the at least one signal lead of the non-volatile memory (SP).

10. The electronic apparatus as in claim 9, wherein:

a switched position of the second switching device (S2) depends upon which of the intrinsic operating voltage and the external operating voltage powers the electronic apparatus.

11. The electronic apparatus as in claim 3, wherein:

the interface (I) has a protection circuit for protecting against damaging voltages passing across said interface.

12. The electronic apparatus as in claim 3, wherein: at least the non-volatile memory (SP) and the switching arrangement (S) can be supplied with energy by the external operating voltage (U+, U−) via the interface (I).

13. The electronic apparatus as in claim 1, wherein:

the interface, in addition to contacts (KUA, KGNDA, KTA, KDA), , includes inter-cooperating structures which make difficult an unintentional and unauthorized access to interface contacts unless these inter-cooperating structures are engaged with one another.

14. The electronic apparatus as claim 13, wherein:

the electronic apparatus (A) has a housing which, relative to its interface and relative to a second housing of the second electronic apparatus (B) and its interface, is so arranged, that the interface and the second interface can be coupled together for transferring data, only by interplugging the two electronic apparatus together.

15. A system as in claim 3 wherein the first and second interfaces (I) of the first and the second electronic apparatus can be coupled together so that when the first electronic apparatus (A) is coupled to an operational voltage source (UB) the second electronic apparatus (B) is supplied with the operational voltage (U+U−)from the first electronic apparatus (A) via the first and second interfaces (I), and so that, through this coupling of the two electronic apparatus (A, B), the first and second switching arrangements (S) of the electronic apparatus (A, B) are respectively each placed in a switched position that a data transfer from the second non-volatile memory (SP) of the second electrical apparatus (B) to the non-volatile memory (SP) of the first electronic apparatus (A) takes place under control of the microprocessor (MP) of the first electronic apparatus (A).

16. The electronic apparatus as in claim 1, wherein:

the interface includes contacts and the electronic apparatus is otherwise so arranged that the interface and the second interface can be plugged directly together without the use of a further intermediate coupling element.

17. The electronic apparatus as in claim 1, wherein:

all hardware elements ($12$, $Z10$, $R11$, $R_{12}$, $R_{14}$, $R_{15}$), other than the microprocessor and non-volatile memory are electronic components having not more than two operating voltage terminals so that all electronic components can be activated by application of only two voltage levels of operating voltage.

18. A system as in apparatus for transfer of data according to claim 17 wherein for each electronic apparatus:

the microprocessor (MP), during a period in which data is written into the non-volatile memory (SP), already reads out data from the non-volatile memory (SP) of another electronic apparatus coupled to its interface.

19. The electronic apparatus as in claim 1, wherein:

said energy supply circuit includes a power supply rail (18) from which the microprocessor is supplied with current and this power supply rail (18) is coupled to an additional energy storer (3) that receives and temporarily stores energy it receives from the intrinsic operating voltage.

20. The electronic apparatus as in claim 1, wherein:

said energy supply circuit includes an operating voltage path and wherein:

an electronic valve (12) is coupled in an operating voltage path between the microprocessor and the non-volatile memory.

21. The electronic apparatus as in claim 20, wherein:

at least a part of a boot-program of the microprocessor (10) is stored in the non-volatile memory (11) which can be supplied with the operating voltage via the interface to the second electronic apparatus.

22. The electronic apparatus as in claim 1, wherein:

the non-volatile memory (11) has an ENABLE- or NOT_ENABLE/INHIBIT-Input (11.1) whose status can be inquired and set by the microprocessor.

23. The electronic apparatus as in claim 22, wherein:

said data transfer circuit includes a path (17) for inquiring and setting the ENABLE- or NOT-ENABLE/INHIBIT-input (11.1) which is coupled through a resistor (Z10) with the operating voltage.

24. The electronic apparatus as in claim 1, wherein:

the data transfer circuit includes a data line (13) between the microprocessor and the non-volatile memory which is coupled via a terminal resistor ($R_{12}$) with a reference potential (GND).

25. Process for copying the contents of a second electronic apparatus (B) which has a second microprocessor (MP2), a second non-volatile memory (SP2) and a second interface (KUB, KGNDB, KTB, KDB), into a first similarly-structured electronic apparatus (A) having a similarly structured first interface, a first microprocessor and a first non-volatile memory (SP1) whereby the first interface is so arranged that it can be coupled with the second interface of the second similarly-structured, electronic apparatus, said process including the following steps:

(1) coupling the first interface of the first electronic apparatus with the second interface of the second electronic apparatus;

(2) applying a normal operational voltage to terminals (K10, K11) of the first electronic apparatus (A);

(3) initially, immediately, deactivating the first non-volatile memory component (11) of the first electronic apparatus (A) in response to this application of voltage and immediately activating the second non-volatile memory component (21) in the second electronic apparatus (B) in response to this application of voltage, (4) recording with the first microprocessor of the first electronic apparatus (A), data from the second non-volatile memory (SP1) by initiating and carrying out a reading of data from the second non-volatile memory (SP2) of the second electronic apparatus (B) into a working memory area (10.5) of the first microprocessor (10) of the first electronic apparatus (A);

(5) Monitoring, upon completion of this reading, a signal level (DATA; $U_{R14}$), which is positively caused to pass over the first and second interfaces away from the second electronic apparatus (B) into the first electronic apparatus (A), to indicate to the first microprocessor (10) of the first electronic apparatus (A) the existence of a coupling with the second electronic apparatus (B);

(6) Separating the first and second electronic apparatuses (A) and (B), while maintaining the current supply to the first electronic apparatus (A);

(7) Recognizing by means of the level monitoring in step (5) the separation of the interfaces as a true condition for a now possible reverse writing of data previously read into said first working memory area (10.5) of the first microprocessor (10) of the first electronic apparatus (A) into the first non-volatile memory (SP1), of the first electronic apparatus (A);

(8) Initiating and carrying out a reverse writing of said data from the working memory area (10.5) into the first non-volatile memory (SP1) of the first electronic apparatus (A) and waiting until this is completed.

26. Process as in claim 25, wherein is included the further step of (9) Waiting until the microprocessor (10) has started anew by normally booting up an application of the first electronic apparatus (A) and the first electronic apparatus (A) has thus achieve operability.

27. Process as in claim 26, wherein is included the further step:

(10) Testing during the boot up data which came from the non-volatile memory (21) of the second electronic apparatus (B) into the non-volatile memory (11) of the first electronic apparatus (A) to determine the correctness of the completed data transmission.

28. Process according to claim 26, wherein is included the further step of (11) Recognizing from an achieved operational readiness of the first electronic apparatus (A), a correctness of the completed data transmission from the non-volatile memory (21) of the second electronic apparatus (B) into the non-volatile memory (11) of the first electronic apparatus (A).

29. The process according to claim 25 wherein the second electronic apparatus B is a production-tool apparatus used during production of new electronic apparatus, and said first electronic apparatus A is a newly produced apparatus.

30. A system comprising a plurality of Electronic apparatus each including a microprocessor (MP; MPI, 10), a non-volatile memory (SP; SP1) and an interface (I; KUA, KGNDA, KTA, KDA, KCA), with a first interface (I; KUA, KGNDA, KTA, KDA) of a first electronic apparatus (A) of the system being adapted to be coupled with a corresponding second interface (I; KUB, KGNDB, KTB, KDB) of a second electronic apparatus (B) of the system; said first electronic apparatus having a first microprocessor (MP; MPI, 10), a first non-volatile memory (SP; SP1), a first energy supply circuit, and a first data transfer circuit and said second electronic apparatus having a second microprocessor (MP; MPI, 10), a second non-volatile memory (SP; SP1), a second energy supply circuit, and a second data transfer circuit;

wherein, the first energy supply circuit includes first terminals which, when an operating voltage is applied thereto, supplies an operating voltage to the first microprocessor and the first non-volatile memory and, at the same time, supplies an operating voltage to the first interface for thereby supplying an operating voltage to the second electronic apparatus when said first and second interfaces are coupled;

Wherein said second energy supply circuit includes means for powering said second non-volatile memory with an operating voltage received by said second electronic apparatus at said second interface;

wherein said first and second data transfer circuits and said first microprocessor cooperate to transmit data from said second non-volatile memory to said first non-volatile memory across said first and second interfaces when they are coupled, in response to said second non-volatile memory being powered with an operating voltage received from said first energy supply circuit across said first and second interfaces.

* * * * *